United States Patent
Negishi et al.

(10) Patent No.: US 6,563,709 B2
(45) Date of Patent: May 13, 2003

(54) LIQUID-COOLED HEAT SINK AND MANUFACTURING METHOD THEREOF

(75) Inventors: Takeshi Negishi, Saitama (JP); Toshiyuki Nagase, Saitama (JP); Yoshiyuki Nagatomo, Saitama (JP); Shoichi Shimamura, Saitama (JP); Asao Tokiwa, Sunto-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 09/907,805

(22) Filed: Jul. 19, 2001

(65) Prior Publication Data

US 2002/0101718 A1 Aug. 1, 2002

(30) Foreign Application Priority Data

Jul. 21, 2000 (JP) ........................................ 2000-219971
Feb. 5, 2001 (JP) ........................................ 2001-027617

(51) Int. Cl.⁷ ................................................ H05K 7/20
(52) U.S. Cl. ..................... 361/699; 165/80.4; 174/15.1; 257/714
(58) Field of Search .............................. 165/80.3, 80.4, 165/185; 174/15.1; 257/714–716; 361/688–689, 690, 698–703, 715

(56) References Cited

U.S. PATENT DOCUMENTS 3,327,776 A * 10/1965 Butt ........................ 165/80.4
5,526,231 A * 6/1996 Arz et al. .................. 361/707
6,052,284 A * 4/2000 Suga et al. ................ 361/699
6,166,907 A * 12/2000 Chien ....................... 361/699

FOREIGN PATENT DOCUMENTS

| DE | 4131739 | 4/1993 |
|---|---|---|
| DE | 4421025 | 12/1995 |
| DE | 19514544 | 10/1996 |
| DE | 19653956 | 6/1997 |
| DE | 19704934 | 8/1998 |
| EP | 798954 | 10/1997 |

* cited by examiner

Primary Examiner—Gregory Thompson
(74) Attorney, Agent, or Firm—Rader, Fishman & Grauer PLLC

(57) ABSTRACT

A heat sink is obtained that has high thermal conductivity as well as satisfactory moldability and corrosion resistance by using a malleable material made of aluminum or aluminum alloy. Liquid cooled heat sink 11 has a passage 23 in which coolant is able to pass, and is joined to a ceramic substrate. A plurality of through holes 12 extending from one end to the other end are formed by a plurality of dividing walls 13 through 15 in flat casing 12 of which both ends are open, and notches 16 are formed on one or both ends of the plurality of dividing walls. Corrugated fins 17 are respectively inserted into each of the plurality of through holes, and each through hole is demarcated into a plurality of slots 12b extending from one end to the other end of the casing by these fins. Both ends of the casing are closed by a pair of covers 18 and 19, and coolant inlet 18a and outlet 18b are formed in the covers. The above passage is formed by communication of the notches and slots, and the above inlet and outlet are positioned on both ends of the passage.

9 Claims, 4 Drawing Sheets

US 6,563,709 B2

LIQUID-COOLED HEAT SINK AND MANUFACTURING METHOD THEREOF

BACKGROUND OF THE INVENTION

1. Technical Field

The present invention relates to a liquid-cooled heat sink and a manufacturing method thereof which is connected to a semiconductor device through a ceramic substrate, and discharges a coolant after the coolant has absorbed the heat emitted by the semiconductor device.

2. Description of the Related Art

As shown in FIGS. 5 and 6, a conventional example of this type of heat sink is a liquid-cooled heat sink 1 in which a flat bar formed from a malleable material made of aluminum or aluminum alloy is cut to a prescribed length, flat block 2 is fabricated by milling in which a meandering groove 2*a* is formed, cover 3 is fabricated by cutting a bar formed from a malleable material made of aluminum or aluminum alloy to a prescribed length, and this cover 3 is placed over the above flat block 2 so as to form passage 4 in which coolant passes through the above grooves 2*a*.

The above liquid-cooled heat sink 1 has the problem of having an extremely large number of machining steps which increases the production cost.

In order to solve this problem, the present invention provides a liquid-cooled heat ink in which the above flat block and cover are formed by aluminum die casting. In this heat sink, since the grooves and so forth can be formed with good precision by cast extraction, the number of machining steps can be reduced considerably.

However, in contrast to the thermal conductivity of a malleable material made of aluminum or aluminum alloy being about 180 to 230 W/m.° C., the thermal conductivity of the aluminum material for die casting (ADC12) in the above liquid-cooled heat sink formed by aluminum die casting of the prior art is about 50% of the above malleable material at about 92 W/m.° C., thereby resulting in the problem of inferior heat radiation efficiency.

In addition, when a heat sink is fabricated by aluminum die casting, solidification and shrinkage causes cracks as well as voids depending on the shape of the heat sink, thereby resulting in the risk of leakage of coolant.

SUMMARY OF THE INVENTION

A first object of the present invention is to provide a liquid-cooled heat sink and a manufacturing method thereof that is able to obtain high thermal conductivity as well as satisfactory moldability and corrosion resistance by using a malleable material made of aluminum or aluminum alloy, while also being able to prevent leakage of coolant by preventing the occurrence of cracks and so forth.

A second object of the present invention is to provide a liquid-cooled heat sink and a manufacturing method thereof that is able to improve the heat radiation efficiency of the heat sink by increasing the amount of heat absorbed from the casing and fins by coolant passing through a passage as a result of increasing the contact surface area with the coolant, snaking the passage, or allowing heat to rapidly transfer to the fins from upper and lower walls of the casing.

A third object of the present invention is to provide a liquid-cooled heat sink and a manufacturing method thereof that is able to inhibit increases in production cost by forming through holes by extrusion molding to reduce the number of machining steps, or by unitarily forming the fins and covers with the casing in a single step.

As shown in FIG. 1, the invention as claimed in claim 1 is an improvement of a liquid-cooled heat sink having a passage 23 in which coolant is able to pass and which is joined to a ceramic substrate.

Its characteristic constitution is comprised of: a casing 12 of which both ends are open and in which a plurality of through holes 12*a* extending from one end to the other end are formed by a plurality of dividing walls 13–15, notches 16 formed in one or both ends of the plurality of dividing walls 13–15, a corrugated fin 17 inserted into each of the plurality of through holes 12*a* which demarcates each of the through holes 12*a* into a plurality of slots 12*b* extending from one end to the other end of casing 12, a pair of covers 18,19 that close both ends of casing 12, and an inlet 18*a* and outlet 18*b* of the coolant formed in casing 12 or covers 18,19; wherein, passage 23 is formed by communication of notches 16 and slots 12*b*, and inlet 18*a* and outlet 18*b* are composed so as to be positioned on both ends of passage 23.

In this liquid-cooled heat sink according to claim 1, since fin 17 is inserted into each through hole 12*a*, the contact surface area between heat sink 11 and coolant increases, thereby making it possible to improve the heat radiation efficiency of heat sink 11.

The invention as claimed in claim 2 is the invention as claimed in 1 wherein, as shown in FIG. 1, notches 16 are composed of first notches 16*a* formed in one end of very other plurality of dividing walls 13–15, and a second notch 16*b* formed in the other end of dividing wall 14 in which said first notches 16*a* are not formed, and passage 23 is composed so as to snake by communicating with said first notches 16*a*, second notch 16*b* and slots 12*b*.

In this liquid-cooled heat sink according to claim 2, since passage 23 snakes, the amount of heat absorbed from casing 12 and fins 17 by coolant that passes through this passage 23 increases, thereby making it possible to improve the heat radiation efficiency of heat sink 11.

As shown in FIGS. 1 and 3, the invention as claimed in claim 3 is a production method of a liquid-cooled heat sink comprising: a step in which a casing 12, of which both ends are open and in which a plurality of through holes 12*a* extending from one end to the other end are formed by a plurality of dividing walls 13–15, is fabricated by extrusion molding of a malleable material made of aluminum or aluminum alloy, a step in which notches 16 are formed by milling in one or both ends of the plurality of dividing walls 13–15, a step in which each of the through holes 12*a* is demarcated into a plurality of slots 12*b* extending from one end to the other end of casing 12 by inserting a corrugated fin 17 into each of the plurality of through holes 12*a*, and a step in which a passage 23 is formed that is composed of notches 16 and slots 12*b* by closing both ends of casing 12 with a pair of covers 18,19.

In this production method of a liquid-cooled heat sink according to claim 3, since heat sink 11 is formed using a malleable material made of aluminum or aluminum alloy, a heat sink 11 can be obtained having high thermal conductivity as well as satisfactory moldability and corrosion resistance. In addition, since through holes 12*a* serving as passage 23 can be formed by extrusion molding, the number of machining steps can be reduced as compared with heat sinks of the prior art, thereby making it possible to inhibit increases in production costs.

As shown in FIGS. 1 and 3, the invention as claimed in claim 4 is the invention as claimed in claim 3 wherein, notches 16 are composed of first notches 16*a* formed by milling in one end of every other plurality of dividing walls 13–15, and a second notch 16b formed by milling in the other end of dividing wall 14 in which first notches 16a are not formed, and passage 23, which snakes by communicating with first notches 16a, second notch 16b and slots 12b, is formed by closing both ends of casing 12 with covers 18,19.

In this production method of a liquid-cooled heat sink according to claim 4, heat sink 11 of the above claim 2 can be fabricated by snaking passage 23 with only a slight increase in production cost.

As shown in FIGS. 1 through 3, the invention as claimed in claim 5 is the invention as claimed in claim 3 or 4 wherein, after forming fins 17 and covers 18,19 from a brazing sheet in which a 4000 series Al—Si alloy brazing material is coated by cladding onto the surface of a malleable material made of aluminum or aluminum alloy, and assembling fins 17 and covers 18,19 in casing 12, fins 17 and covers 18,19 are brazed with said 4000 series Al—Si alloy brazing material to casing 12 by holding for 0.1 to 1 hour at 570 to 620° C. in a vacuum or inert gas atmosphere.

In this production method of a liquid-cooled heat sink according to claim 5, since fins 17 and covers 18,19 can be integrated with casing 12 in a single step, increases in the production cost of heat sink 11 can be suppressed.

DETAILED DESCRIPTION OF THE INVENTION

The following provides an explanation of a first embodiment of the present invention with reference to the drawings.

Figure 1:
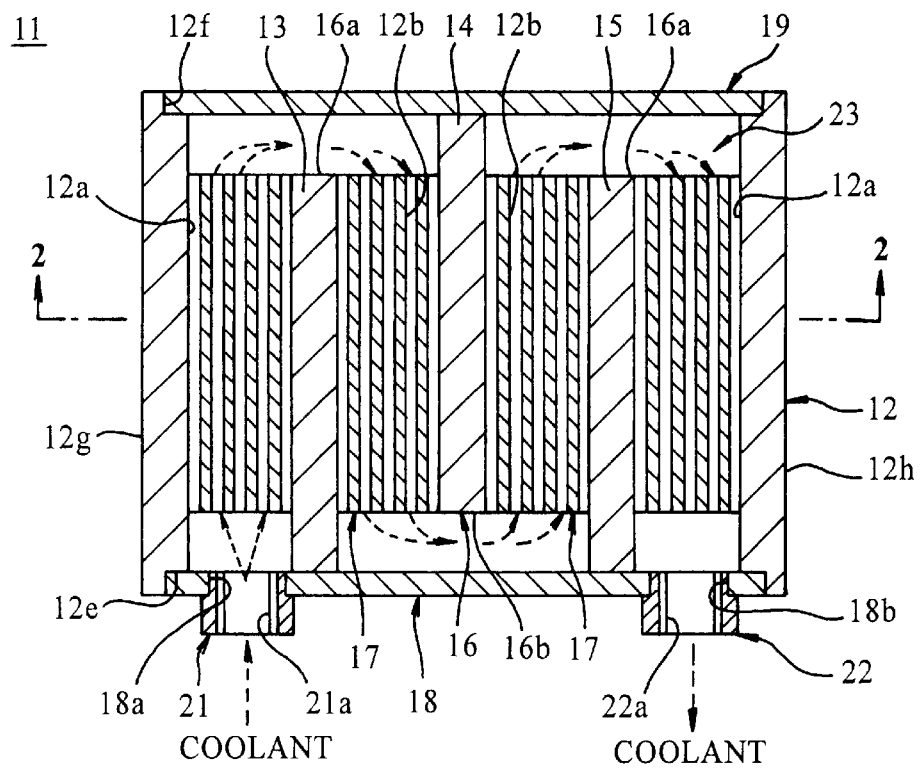
FIG. 1 is a cross-sectional view taken along line 1—1 of FIG. 2 that shows a liquid-cooled heat sink of a first embodiment of the present invention.
Figure 2:
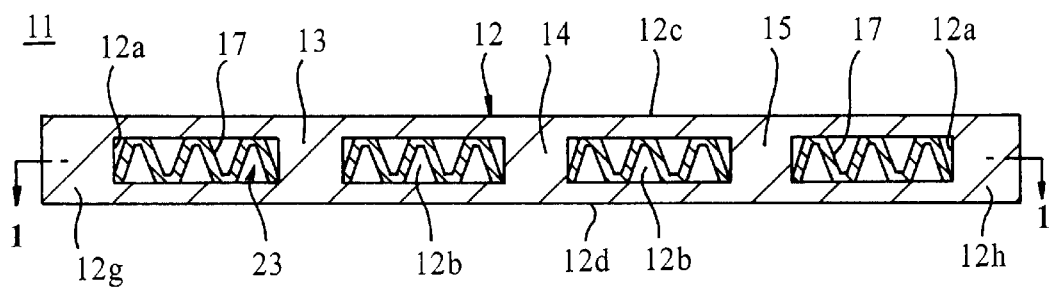
FIG. 2 is a cross-sectional view taken along line 2—2 of FIG. 1.

As shown in FIGS. 1 and 2, liquid-cooled heat sink 11 is provided with flat casing 12, of which both ends are open and in which a plurality of through holes 12a extending from one end to the other end are formed by a plurality of dividing walls 13–15, and notches 16 formed in both ends or one end of the plurality of dividing walls 13–15. The plurality of dividing walls 13–15 are comprised of three dividing walls in this embodiment, and four through holes 12a of the same shape are respectively formed by these three dividing walls 13–15. Furthermore, the number of dividing walls is not limited to three, but may also be 1, 2 or 4. In addition, notches 16 are composed of first notches 16a respectively formed in one end of every other plurality of dividing walls 13–15, and second notch 16b formed in the other end of dividing wall 14 in which first notches 16a are not formed. In this embodiment, first notches 16a are respectively formed on one end of two dividing walls 13 and 15 on both sides, while second notch 16b is formed on the other end of center dividing wall 14.

Corrugated fins 17 are respectively inserted into each through hole 12a. These fins 17 are inserted into each through hole 12a so as to demarcate each through hole 12a into a plurality of slots 12b extending from one end to the other end of casing 12. Namely, the upper ends and lower ends of fins 17 respectively adhere to upper wall 12c and lower wall 12d of casing 12, and the horizontal cross-sections of slots 12b are formed to be roughly trapezoidal. Furthermore, the length of fins 17 is formed to be the length resulting from subtracting the depths of first and second notches 16a and 16b from the total length of casing 12. Both open ends of casing 12 are closed by a pair of covers 18 and 19. A pair of recesses 12e and 12f are respectively formed in both ends of casing 12 having a shape that corresponds to the pair of covers 18 and 19, and the depths of these recesses 12e and 12f are formed to be roughly equal to the thickness of covers 18 and 19. Both ends of casing 12 are closed by respectively inserting the above covers 18 and 19 into the above recesses 12e and 12f.

Coolant inlet 18a and outlet 18b are respectively formed in both ends of one cover 18. Inlet 18a is formed so as to oppose the through hole 12a on the left end, while inlet 18b is formed so as to oppose through hole 12a on the right end. In addition, sockets 21 and 22 having female threads 21a and 22a are respectively protruding from inlet 18a and outlet 18b. Furthermore, the inlet and outlet may be formed in the casing and not in the covers. In addition, snaking passage 23 is formed by communicating with first notches 16a, second notch 16b and slots 12b inside through holes 12a as a result of closing both ends of casing 12 with covers 18 and 19. Namely, coolant that has entered from inlet 18a flows by snaking through passage 23 as shown by the broken line arrows of FIG. 1, and then is discharged from outlet 18b. Furthermore, examples of the above coolant include water, alcohols such as ethylene glycol and organic solvents such as hydrocarbon-based solvents.

Figure 3:
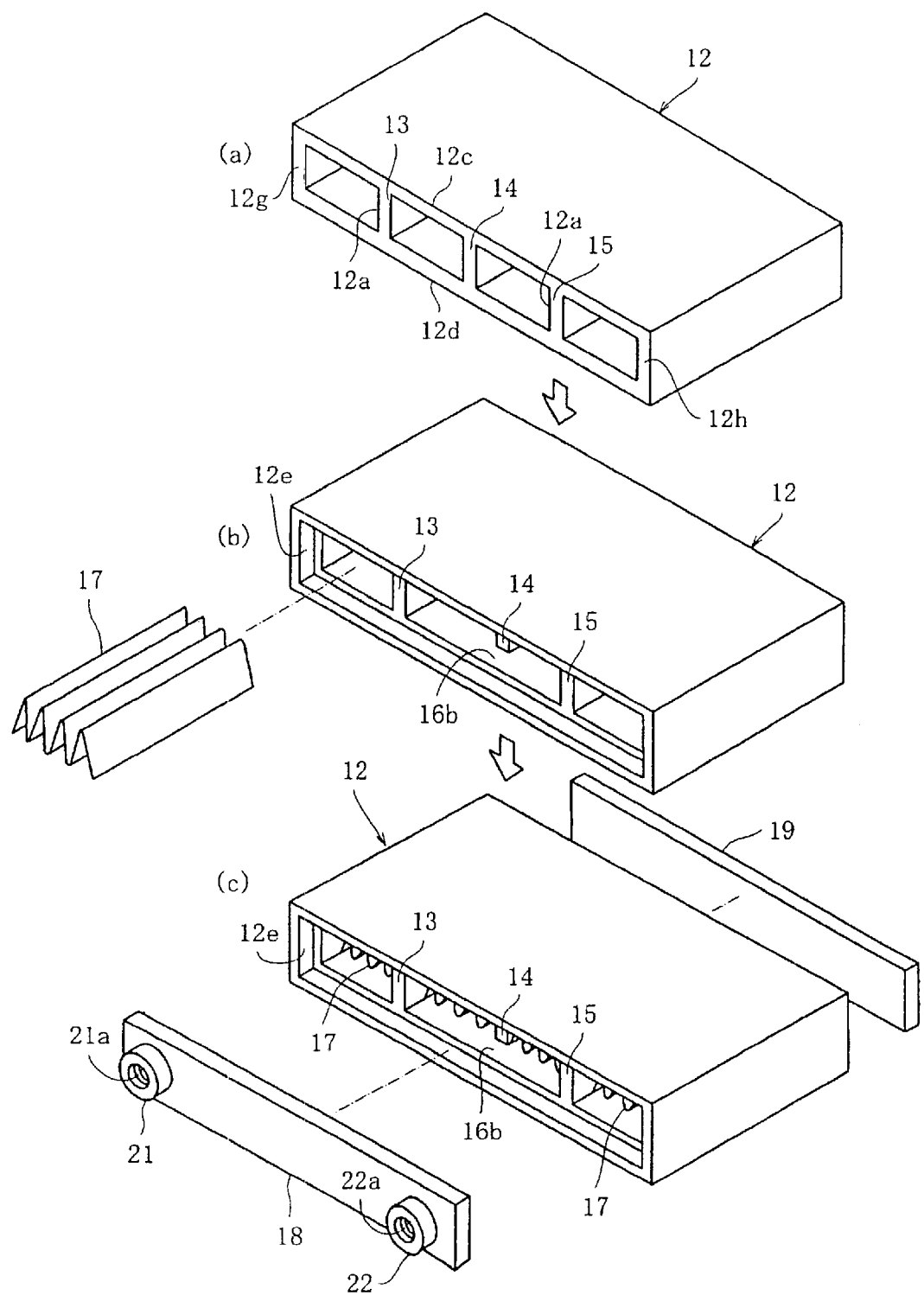
FIG. 3 is a process drawing showing the production procedure of that heat sink.

The following provides an explanation of a production method of a liquid-cooled heat sink composed in this manner with reference to FIGS. 1 through 3.

To begin with, casing 12, of which both ends are open, is fabricated by extrusion molding of a malleable material made of aluminum or aluminum alloy (FIG. 3(a)). Casing 12 is formed from a malleable material such as series 1000 aluminum, series 3000 Al—Mn alloy or series 6000 Al—Mg—Si alloy. Three dividing walls 13–15 are formed by extrusion molding in this casing 12, and four through holes 12a, which extend from one end to the other end, are formed in casing 12 by the above dividing walls 13–15. Next, simultaneous to forming notches 16 by milling in both ends or one end of these three dividing walls 13–15, a pair of recesses 12e and 12f are formed by milling in both end surfaces of casing 12 (FIG. 3(b)). Notches 16 are comprised of first notches 16a formed by milling in one end of two of the three dividing walls 13 and 15 on both ends, and second notch 16b formed by milling in the other end of central dividing wall 14.

On the other hand, four corrugated fins 17 are fabricated by press molding a brazing sheet in which a 4000 series Al—Si alloy brazing material is coated by cladding onto the surface of a malleable material made of aluminum or aluminum alloy. In addition, a brazing sheet, in which a 4000 series Al—Si alloy brazing material is coated by cladding onto the surface of a malleable material made of aluminum or aluminum alloy, is cut to a prescribed shape to fabricate a pair of covers 18 and 19, and coolant inlet 18a and outlet 18b are formed on both ends of one cover 18. Next, the above four fins 17 are respectively inserted into the four through holes 12a of casing 12, and after inserting the above pair of covers 18 and 19 into the above pair of recesses 12e and 12f, a pair of sockets 21 and 22 are inserted into the above inlet 18a and outlet 18b to assemble heat sink 11 (FIG. 3(c)).

Moreover, this assembled heat sink 11 is placed in a heat treatment oven, a vacuum is drawn inside the oven, and heat sink 11 is held in the oven for 0.1 to 1 hour, and preferably 0.1 to 0.5 hours, at 570 to 620° C., and preferably 590 to 600° C. As a result, fins 17 and covers 18 and 19 are brazed to casing 12 by the series 4000 Al—Si alloy brazing material, and sockets 21 and 22 are brazed to one cover 18. Thus, heat sink 11 can be produced by this comparatively simple step. Here, the reason for limiting the above heat treatment temperature of heat sink 11 to the range of 570 to 620° C. is that, if the temperature is below 570° C., each member cannot be completely joined, while if the temperature exceeds 620° C., casing 12 ends up partially melting. In addition, the reason for limiting the above treatment time of heat sink 11 to the range of 0.1 to 1 hour is that, if the time is less than 0.1 hours, each member cannot be completely joined, while if the time exceeds 1 hour, the brazing material is dispersed in the casing. Furthermore, a semiconductor device is joined to both or one of the upper surface or lower surface of the above heat sink 11 by means of a ceramic substrate. In addition, the inside of the heat treatment oven containing the heat sink does not have to be at a vacuum, but rather may contain an atmosphere of an inert gas such as argon gas or nitrogen gas.

In the liquid-cooled heat sink produced in this manner, since heat sink 11 is formed using a malleable material made of aluminum or aluminum alloy, high thermal conductivity as well as satisfactory moldability and corrosion resistance can be obtained.

In addition, since fins 17 are inserted into through holes 12a, the contact surface area between heat sink 11 and the coolant that passes through passage 23 increases, and passage 23 snakes as a result of forming first notch 16a, second notch 16b and first notch 16a in that order from the left side in three dividing walls 13–15. As a result, since the amount of heat absorbed from casing 12 and fins 17 by coolant passing through passage 23 increases, the heat radiation efficiency of heat sink 11 can be improved.

Moreover, since heat sink 11 can be heat treated in a single step, namely since fins 17 and covers 18 and 19 can be integrated with casing 12 in a single step, increases in the production cost of heat sink 11 can be suppressed.

Figure 4:
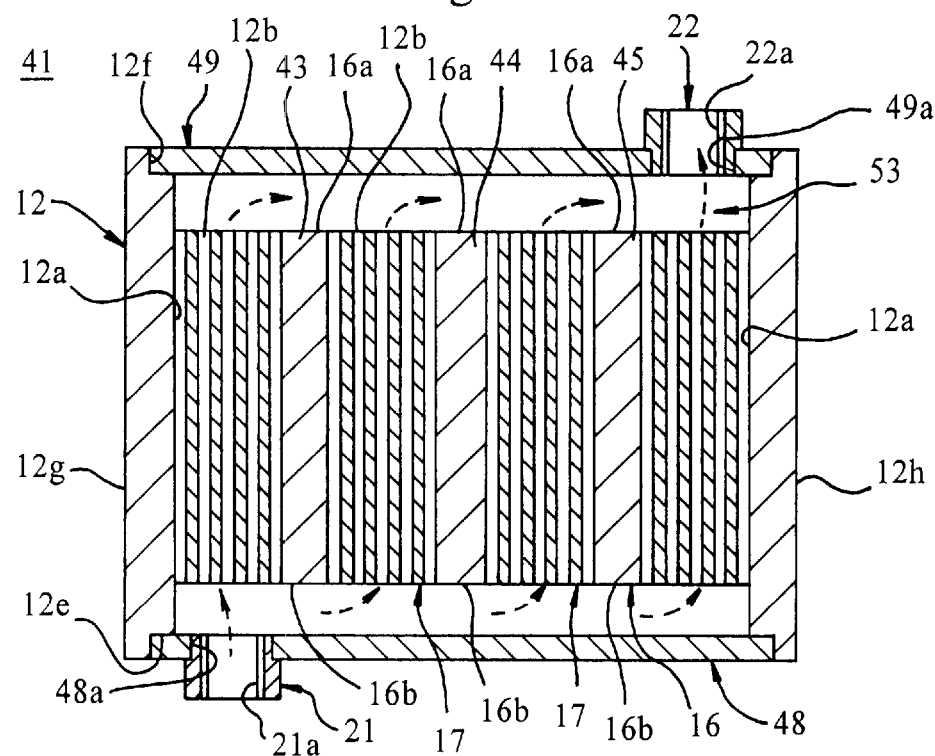
FIG. 4 is a cross-sectional view corresponding to FIG. 1 showing a liquid-cooled heat sink of a second embodiment of the present invention.
Figure 5:
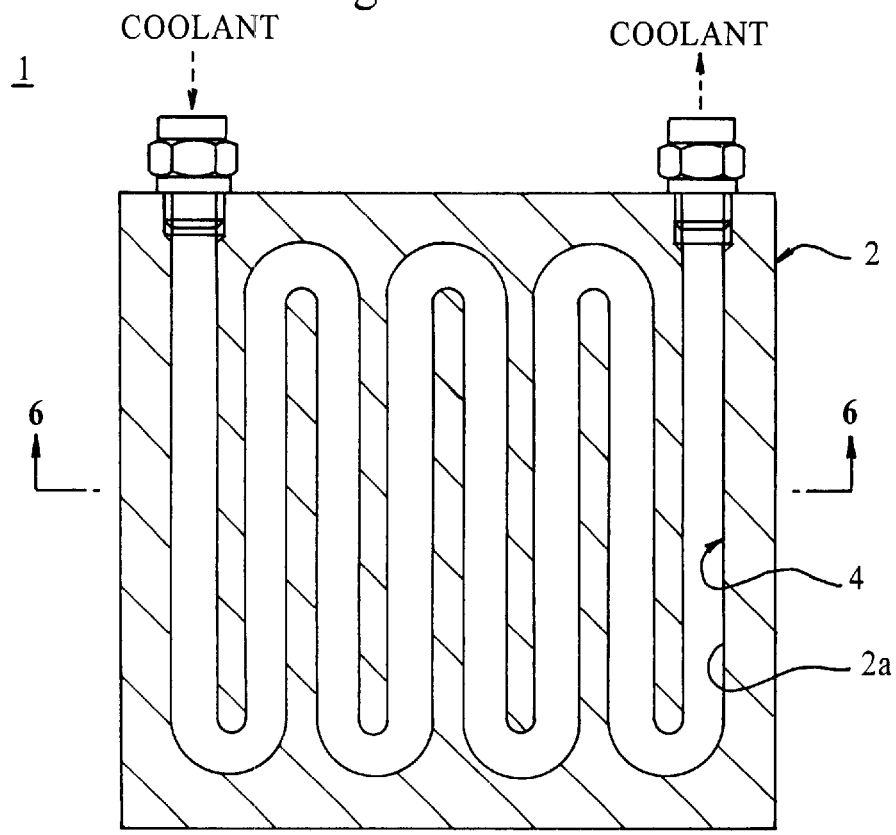
FIG. 5 is a cross-sectional view taken along line 5—5 of FIG. 6 showing a liquid-cooled heat sink of the prior art.
Figure 6:
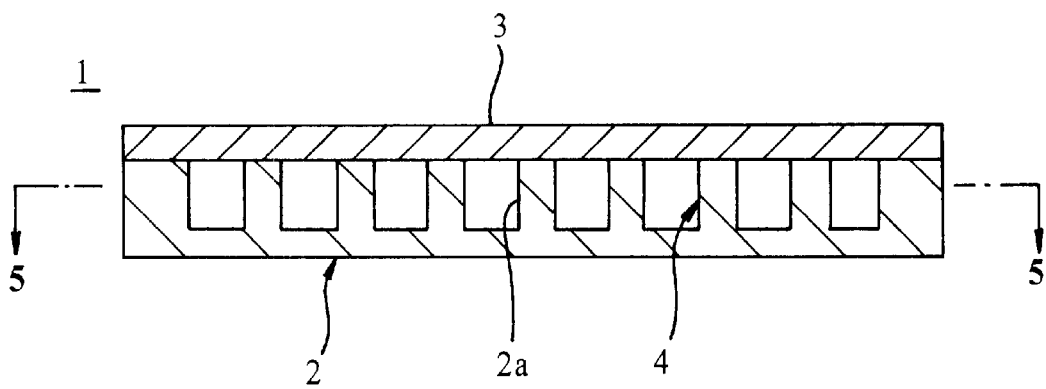
FIG. 6 is a cross-sectional view taken along line 6—6 of FIG. 5.

FIG. 4 shows a second embodiment of the present invention. Those reference symbols used in FIG. 1 indicate the same components in FIG. 4.

In this embodiment, notches 16 are formed on both ends of three dividing walls 43–45 of casing 12. Namely, first notches 16a are respective formed in one end of three dividing walls 43–45, and second notches 16b are respectively formed in the other end of three dividing walls 43–45. In addition, coolant inlet 48a is formed in opposition to left end through hole 12a in one cover 48 of a pair of covers 48 and 49, and coolant outlet 49b is formed in opposition to right end through hole 12a in the other cover 49. Sockets 21 and 22 are respectively projecting from inlet 48a and outlet 49a. The remainder of this embodiment is composed in the same manner as the first embodiment.

In this liquid cooled heat sink 41 composed in this manner, coolant that has flown in from inlet 48a passes through slots 12b of four through holes 12a and then flows out from outlet 49a as indicated with the broken line arrows. As a result, since coolant flows through passage 53 rapidly in the portion of passage 53 that is not snaked, flow path resistance can be reduced. Since other actions and operations are roughly the same as the first embodiment, repetition of their explanation is omitted.

Furthermore, in the above first and second embodiments, fins may be formed to have a wavy shape (wavy fins) in their lengthwise direction (in the direction in which coolant flows), fine surface irregularities may be formed in the fin surface, ledges may be formed at intermediate locations of the fins to create a structure in which the slots suddenly expand or contract along the flow of coolant, orifices that obstruct a portion of the pores may be provided in the fins, or the surface of the fins may be roughened. In this case, although the flow path resistance of the coolant that passes through the slots increases, since the flow of this coolant becomes turbulent, the heat transfer efficiency between the fins and coolant improves, thereby enabling efficient heat exchange.

As has been described above, according to the present invention, since a plurality of through holes are formed by a dividing walls in a flat casing that is open on both ends, notches are formed in one or both ends of these dividing walls, corrugated fins are inserted into the through holes, each through hole is demarcated by a plurality of slots, both ends of the casing are closed by a pair of covers, and a coolant inlet and outlet are formed in the casing or covers, the contact surface area between the heat sink and coolant increases, thereby making it possible improve the heat radiation efficiency of the heat sink.

In addition, if composed so that the notches are comprised of first notches formed on one end of every other of the plurality of dividing walls, and a second notch formed on the other end of the dividing wall in which the first notches are not formed, since the passage snakes as a result of communicating with the first notches, second notch and slots, the amount of heat absorbed from the casing and fins by the coolant that passes through this passage increases, thereby making it possible to improve the heat radiation efficiency of the heat sink.

In addition, if a casing is fabricated, of which both ends are open and in which a plurality of through holes are formed by a plurality of dividing walls, by extrusion molding of a malleable material made of aluminum and so forth, notches are formed by milling in one or both ends of the plurality of dividing walls, corrugated fins are inserted into the through holes, each through hole is demarcated by a plurality of slots, and both ends of the casing are closed by a pair of covers, a heat sink can be obtained that has high thermal conductivity as well as satisfactory moldability and corrosion resistance. In addition, since the through holes that form the passage are formed by extrusion molding, the number of machining steps can be reduced as compared with conventional heat sinks, thereby making it possible to suppress increases in production costs. In addition, in comparison with conventional heat sink production methods using aluminum die casting for which there is the risk of the occurrence of solidification and shrinkage cracks, etc., in the heat sink production method of the present invention, the above cracking and so forth does not occur, and there is therefore no leakage of coolant.

In addition, if the above first and second notches are formed by milling, the passage can be snaked with only a slight increase in production cost.

Moreover, if the fins and covers are brazed to the casing with a 4000 series Al—Si alloy brazing material by forming the fins and covers using a brazing sheet in which a 4000 series Al—Si alloy brazing material is coated by cladding onto the surface of a malleable material made of aluminum or aluminum alloy, temporarily assembling the fins and covers in the casing, and then subjecting to a prescribed heat treatment, since the fins and covers are able to be integrated with the casing in a single step, increases in production costs can be suppressed.

What is claimed is:

1. A liquid-cooled heat sink which has a passage (23) through which a liquid coolant passes and which is adapted to connect to a ceramic substrate, comprising:

a casing (12) of unitary construction and of which opposing ends define respective openings into said casing and in which a plurality of through holes (12a) extending to and between the openings are formed by a plurality of dividing walls (13 through 15) formed integrally with said casing, notches (16) formed in at least one end portion of said plurality of dividing walls (13 through 15), a corrugated fin (17) inserted into each of said plurality of through holes (12a) which demarcates each of said through holes (12a) into a plurality of slots (12b) extending from one end to the other end of said through holes (12a), a pair of covers (18,19) that close respective opposing ends of said casing (12), and an inlet (18a) and outlet (18b) formed in said liquid-cooled heat sink; wherein, said passage (23) is formed by communication of said notches (16) and said slots (12b), and said inlet (18a) and said outlet (18b) are composed so as to be positioned on both ends of said passage (23).

2. A liquid-cooled heat sink according to claim 1 wherein, notches (16) are formed in one end portion of every other one of the plurality of dividing walls (13 through 15), and in an opposite end portion of a remaining dividing wall (14), and passage (23) is composed so as to snake by communicating with said notches and slots (12b).

3. A manufacturing method of a liquid-cooled heat sink comprising:

a step in which a casing (12) of unitary construction, of which opposing ends define respective openings into said casing and in which a plurality of through holes (12a) extending to and between the openings are formed by a plurality of dividing walls (13 through 15) formed integrally with said casing, is fabricated by extrusion molding of a malleable material made of aluminum or aluminum alloy, a step in which notches (16) are formed by milling at least one end portion of said plurality of dividing walls (13 through 15), a step in which each of said through holes (12a) is demarcated into a plurality of slots (12b) extending from one end to the other end of said through holes (12a) by inserting a corrugated fin (17) into each of said plurality of through holes (12a), and a step in which a passage (23) is formed that is composed of said notches (16) and said slots (12b) by closing both opposing ends of said casing (12) with a respective one of a pair of covers (18,19).

4. A manufacturing method of a liquid-cooled heat sink according to claim 3 wherein said notches (16) are formed by milling one end portion of every other one of the plurality of dividing walls (13 through 15), and d by milling an opposite end portion of a remaining dividing wall (14), and passage (23), which snakes by communicating with said notches and slots (12b), is formed by closing the opposing ends of casing (12) with covers (18,19).

5. A manufacturing method of a liquid-cooled heat sink according to claim 4 wherein, after forming fins (17) and covers (18,19) from a brazing sheet in which a 4000 series Al—Si alloy brazing material is coated by cladding onto the surface of a malleable material made of aluminum or aluminum alloy, and assembling said fins (17) and covers (18,19) in casing (12), said fins (17) and covers (18,19) are brazed with said 4000 series Al—Si alloy brazing material to said casing (12) by holding for 0.1 to 1 hour at 570 to 620° C. in a vacuum or inert gas atmosphere.

6. A liquid-cooled heat sink adapted to connect to a ceramic substrate, comprising:

a box-shaped casing of unitary construction extending longitudinally along a longitudinal axis and extending transversely therefrom, the casing having opposite ends defining respective openings extending longitudinally into the casing and surrounding the longitudinal axis and including a plurality of dividing walls formed integrally with the casing and extending to and between the respective openings to define a plurality of longitudinally-extending through holes;

a plurality of corrugated fins with each fin extending longitudinally through a respective one of the through holes to define a plurality of slots;

a pair of covers, each cover sized and adapted to close a respective one of the openings by being connected to a respective end of the casing thereby forming a passage internally of the casing, the passage including at least portions of the openings in communication with the slots;

an inlet formed into the liquid-cooled heat sink at one end of the passage; and an outlet formed into the liquid-cooled heat sink at an opposite end of the passage.

7. A liquid-cooled heat sink according to claim 6, wherein the passage meanders inside the liquid-cooled heat sink in a snake-like fashion.

8. A liquid-cooled heat sink according to claim 6, wherein each one of the plurality of slots is configured in cross-section as a trapezoid.

9. A liquid-cooled heat sink according to claim 6, wherein at least one of the plurality of dividing walls contact one of the pair of covers when the pair of covers close the openings.

* * * * *